(12) United States Patent
Song et al.

(10) Patent No.: US 10,147,586 B2
(45) Date of Patent: Dec. 4, 2018

(54) INDUCTIVELY COUPLED COIL AND INDUCTIVELY COUPLED PLASMA DEVICE USING THE SAME

(71) Applicant: BEIJING NAURA MICROELECTRONICS EQUIPMENT CO., LTD., Beijing (CN)

(72) Inventors: Qiaoli Song, Beijing (CN); Jianhui Nan, Beijing (CN)

(73) Assignee: BEIJING NAURA MICROELECTRONICS EQUIPMENT CO., LTD., Beijing (CN)

(*) Notice: Subject to any disclaimer, the term of this patent is extended or adjusted under 35 U.S.C. 154(b) by 232 days.

(21) Appl. No.: 15/378,914

(22) Filed: Dec. 14, 2016

(65) Prior Publication Data

US 2017/0092466 A1 Mar. 30, 2017

Related U.S. Application Data

(62) Division of application No. 12/439,352, filed as application No. PCT/CN2007/000309 on Jan. 26, 2007, now Pat. No. 9,552,965.

(30) Foreign Application Priority Data

Aug. 28, 2006 (CN) .......................... 2006 1 0112658

(51) Int. Cl.
| | |
|---|---|
| *C23C 16/00* | (2006.01) |
| *H01L 21/306* | (2006.01) |
| *H01J 37/32* | (2006.01) |
| *H01F 38/14* | (2006.01) |
| *H01F 27/28* | (2006.01) |
| *H01F 38/10* | (2006.01) |

(52) U.S. Cl.
CPC .......... *H01J 37/3211* (2013.01); *H01F 27/28* (2013.01); *H01F 38/14* (2013.01);
(Continued)

(58) Field of Classification Search
CPC ................. H01J 37/321; H01J 37/3211; H01J 37/32119; H01J 37/32128;
(Continued)

(56) References Cited

U.S. PATENT DOCUMENTS

| | | | | |
|---|---|---|---|---|
| 5,897,713 A | * | 4/1999 | Tomioka | ................ C23C 16/401 |
| 6,164,241 A | * | 12/2000 | Chen | ..................... H01J 37/321 |

(Continued)

FOREIGN PATENT DOCUMENTS

| | | |
|---|---|---|
| CN | 1812010 A | 8/2006 |
| JP | 10092598 A | 4/1984 |

(Continued)

*Primary Examiner* — Luz L Alejandro Mulero
(74) *Attorney, Agent, or Firm* — Anova Law Group, PLLC

(57) ABSTRACT

The present invention discloses an inductively coupled coil and an inductively coupled plasma device using the same. The inductively coupled coil comprises an internal coil and an exterior coil which are respective from each other and coaxially arranged, internal coil comprising a plurality of internal respective branches having the same configurations which are nested together, the plurality of internal respective branches being arranged symmetrically with respect to an axis of the inductively coupled coil; the external coil comprising a plurality of external respective branches having the same configurations which are nested together, the plurality of external respective branches being arranged symmetrically with respect to the axis of the inductively coupled coil. The inductively coupled coil is located on the reaction chamber of the inductively coupled plasma device and is connected to a RF source. It can make the plasma distribute uniformly on the wafer in the reaction chamber so that the difference in chemical reaction rate on the surface of the wafer is small and the quality of the etched wafer is improved. They can be applied in a semiconductor wafer manufacturing apparatus, and they can also be adapted to other apparatuses.

20 Claims, 4 Drawing Sheets

(52) U.S. Cl.
CPC ....... *H01J 37/321* (2013.01); *H01J 37/32119* (2013.01); *H01J 37/32183* (2013.01); *H01F 38/10* (2013.01); *H01J 2237/3344* (2013.01)

(58) Field of Classification Search
CPC ........... H01J 37/32137; H01J 37/32146; H01J 37/32155; H01J 37/32165; H01J 37/32174; H01J 37/32183
USPC ...... 118/723 I, 723 IR, 723 AN; 156/345.48, 156/345.49; 315/111.51
See application file for complete search history.

(56) References Cited

U.S. PATENT DOCUMENTS

| | | | |
|---|---|---|---|
| 6,288,493 B1 * | 9/2001 | Lee | H01J 37/321 315/111.21 |
| 6,414,648 B1 * | 7/2002 | Holland | H01J 37/321 |
| 6,463,875 B1 | 10/2002 | Chen et al. | |
| 6,480,086 B1 | 11/2002 | Kluge et al. | |
| 6,685,798 B1 | 2/2004 | Holland et al. | |
| 7,744,721 B2 | 6/2010 | Edamura et al. | |
| 2002/0186114 A1 | 12/2002 | Basteres et al. | |
| 2005/0034497 A1 | 2/2005 | Steingroever et al. | |

FOREIGN PATENT DOCUMENTS

| | | | |
|---|---|---|---|
| JP | 8050998 A | 2/1996 | |
| JP | 2002519861 A | 7/2002 | |
| JP | 2005303053 A | 10/2005 | |
| JP | 2006073354 A | 3/2006 | |

\* cited by examiner

INDUCTIVELY COUPLED COIL AND INDUCTIVELY COUPLED PLASMA DEVICE USING THE SAME

CROSS REFERENCE TO RELATED APPLICATIONS

This application is a divisional of U.S. patent application Ser. No. 12/439,352, filed on Feb. 27, 2009, which claims priority to PCT Application No. PCT/CN07/00309, filed on Jan. 26, 2007, all of which are incorporated herein by reference in their entirety.

BACKGROUND OF THE INVENTION

Field of the Invention

The present invention relates to an assembly for a semiconductor wafer manufacturing apparatus, more specially, to an inductively coupled coil and an inductively coupled plasma device using the same.

Description of the Related Art

Currently, with high development of electronic technology, there is stricter demand on integration level of IC, thus, IC enterprises have to improve manufacturing process of semiconductor wafers continuously. Plasma apparatuses or devices are widely used in manufacturing process of IC (Integrated Circuit) or MEMS (Micro-Electro-Mechanical System) devices. ICP (Inductively coupled plasma device) is widely used in etch process etc. Plasma is generated by RF gas ionization under low pressure. The plasma contains a large number of active particles such as electrons, ions, atoms, excited molecules and free radical etc. There occur chemical and physical reactions between these active particles and a material surface to be etched, to produce volatile resultants and change nature of the material surface.

An inductively coupled plasma device as shown in FIG. 1 is most commonly used in the current semiconductor etching apparatuses. During manufacturing process of semiconductors, process gas entering into a reaction chamber 3 through a gas inlet 2 on top of a dielectric window 1 is ionized into plasma by an inductively coupled coil 4 provided above, and the generated plasma etches material of the surface of a wafer 5. A molecular pump in the system pumps out discharging gas from the reaction chamber 3 through an outlet 6. During this process, the RF power from the inductively coupled coil 4 generates the plasma in the reaction chamber 3 by ionizing the gas. Presently, radio frequency of 13.56 MHz is applied to the inductively coupled coil 4 so that there is RF current in the inductively coupled coil 4, thus generating variable magnetic field. According to Faraday law, the variable magnetic field will induce electric field so that the reaction gas in the reaction chamber 3 is ionized into plasma. The excited plasma interacts with a workpiece in the chamber, etches the workpiece or deposits material on the workpiece. The workpiece is normally a wafer with circular plane. Due to the gas pumping manner or the asymmetry of the reaction chamber, asymmetry of particle density, temperature and magnetic flux in the reaction chamber would occur. Asymmetry of gas flow results in asymmetry of plasma conductivity, and the asymmetry of plasma conductivity may lead to non-uniformity of deposited power, which may lead to non-uniformity of ionization due to electron colliding. With size of the wafer 5 increasing, the volume of the reaction chamber 3 increases correspondingly. And the non-uniformity of plasma density from the center to periphery becomes more serious. Therefore, there is a problem in non-uniformity of etching rate for most of conventional etching apparatuses, which brings negative influence on the semiconductor manufacturing process.

To obtain relatively uniform etching rate on material surface to be etched, there is a need for achieving relatively uniform distribution of plasma density above the wafer 5 in the reaction chamber 3 so that there is a relatively uniform distribution of plasma above the wafer 5, thus improving quality of etching.

In FIG. 2, a commonly used structure of an inductively coupled coil 4 is shown, which is a planar-and-spiral configuration. However, the plasma excited by this configuration is very non-uniform. Because the electromagnetic field induced by this configuration at the center of the reaction chamber is relatively strong, the plasma density at the center thereof is relatively high, and low plasma density at the periphery can only be remedied via diffusion. This will lead to strict dependency on the gas pressure which only brings most favorable performance in the range of 1-10 m Torr. This may lead to a small adjustable window to the process and great limitations to the semiconductor manufacturing process. When the plasma density distributes uniformly, the etched depth on the wafer or the thickness of the material deposited on the wafer is non-uniform, thus the yield of the devices is also decreased. Especially, when the diameter of the wafer increases from 100 mm to 300 mm, the volume of the reaction chamber increases correspondingly, and it is impossible to obtain uniform plasma density via diffusion.

In addition, when the diameter of the wafer reaches 300 mm, the size of the inductively coupled coil should be correspondingly increased, and the plasma chamber for processing the wafer should also be increased. Therefore, the thickness of the dielectric window 1 is needed to increase accordingly. Otherwise, the dielectric window 1 may not endure the pressure difference between the atmospheric pressure outside the chamber and the vacuum inside the chamber. The dielectric window 1 having such an thickness will lead to decrease of energy coupling efficiency, since there is no enough flux density to excite plasma after the RF field penetrating through the thick dielectric window 1. And the problem with the conventional spiral inductively coupled coil is the generation of non-uniform plasma density. The length of the conventional inductively coupled coil may increase remarkably with the increase of wafer radius, even beyond ⅛ of a RF source wavelength. Thus, the transmission line effect of the inductively coupled coil is obvious, and there exists remarkable variations of current and voltage in the inductively coupled coil, which results in remarkable variation of the magnetic flux density in the plasma and non-uniformity of workpiece processing. On the other hand, when the size of the inductively coupled coil increases, the corresponding inductance will also increase, thus the voltage of both ends of the inductively coupled coil will increase correspondingly. The increased voltage will result in capacitive coupling between the inductively coupled coil and the plasma, and the capacitive coupling increases the kinetic energy of the ion, so that it is hard to control the process precisely. In addition, it will increase micro-loading effect of the wafer and decrease yield of the devices. Further, ions with relatively high kinetic energy collide with the inner walls of the plasma chamber, which will result in particle contamination. And increased inductance will also lead to unstable impedance match and low coupling efficiency. Correspondingly, the non-uniformity of radial plasma density will increase.

SUMMARY OF THE INVENTION

The present invention is directed to solve at least one of the problems existing in the prior art, i.e., to provide an inductively coupled coil and an inductively coupled plasma device. Based on the inductively coupled coil of the present invention the plasma is uniformly distributed above a wafer in a reaction chamber due to an internal coil and an external coil configured by a plurality of respective branches and combination of the internal coil and external coil, so that there is little difference among chemical reaction rate of different area on the wafer surface. In addition, etch rate uniformity and other etch results are improved accordingly.

According to one aspect of the invention, an inductively coupled coil is provided, comprising an internal coil and an external coil which can be respectively and coaxially aligned to each other;

the internal coil comprising a plurality of internal respective branches having the same configurations which may be nested together, the plurality of internal respective branches being arranged symmetrically with respect to an axis of the inductively coupled coil;

the external coil comprising a plurality of external respective branches having the same configurations which may be nested together, the plurality of external respective branches being arranged symmetrically with respect to the axis of the inductively coupled coil; wherein:

the internal coil may have a planar structure or a planar-spatial combined structure, the external coil may have a planar structure or a planar-spatial combined structure;

or the internal coil may have a spatial structure, and the external coil may have a planar structure or a planar-spatial combined structure;

or the internal coil may have a planar structure or a planar-spatial combined structure, and the external coil may have a spatial structure.

According to an aspect of the invention, each respective branch in planar structure parts of the internal coil and/or external coil may be a helical line.

According to an aspect of the invention, each respective branch in planar structure parts of the internal coil and/or external coil may be an archimedes spiral line, an involute line or a vortex line.

According to an aspect of the invention, each respective branch in spatial structure parts of the internal coil and/or external coil spirally may wind upwardly along the axis thereof.

According to an aspect of the invention, diameters of the upward-spirally wound helical line of the spatial structure part may be the same substantially, or the diameters of the ascending helical line may gradually become smaller or larger. The spirally helical line of the spatial structure part may ascend in equal intervals or unequal intervals.

According to an aspect of the invention, the internal coils may comprise two internal respective branches, and the external coil may comprise two external respective branches.

According to another aspect of the invention, an inductively coupled plasma device using the inductively coupled coil described above is provided, comprising a reaction chamber and a dielectric window provided on top of the reaction chamber, the inductively coupled coil may be provided on the dielectric window, and the inductively coupled coil may be connected with a RF source via a match.

According to an aspect of the invention, the internal and external coils of the inductively coupled coil may be connected in parallel and then connected with the match.

According to an aspect of the invention, the internal and external coils of the inductively coupled coil may be connected with the match respectively.

According to an aspect of the invention, the plurality of internal respective branches of the internal coil may be connected in parallel, and an input end of the plurality of internal respective branches connected in parallel may be connected with a variable capacitor in series, an output end thereof may be grounded via a grounded capacitor; the plurality of external respective branches of the external coil may be connected in parallel, and an input end of the plurality of external respective branches connected in parallel may be connected with a variable capacitor in series, an output end thereof may be grounded via a grounded capacitor.

According to an aspect of the invention, input ends of the plurality of the internal respective branches of the internal coil and/or the plurality of the external respective branches of the external coil may be connected with variable capacitors, then connected in parallel, an output end thereof may be grounded via a grounded capacitor.

From the solutions disclosed above, since there is an internal coil and an external coil which are separated from each other and coaxially arranged with each other, the structures of the internal coil and the external coil in the inductively coupled coil and the inductively coupled plasma device can be designed as required, so as to achieve desired electromagnetic field. Further, because the internal coil and the external coil are consist of a plurality of respective branches that are substantially the same and nested together respectively and the respective branches are symmetrically connected in parallel, the inductance of the inductively coupled coil is reduced, and plasma with larger area can be easily obtained, thus ameliorating the uniformity of the plasma in large area process. Meanwhile, the electromagnetic field in the reaction chamber distributes uniformly due to the structure of the inductively coupled coil, and the plasma distributes more uniformly from the center to periphery thereof.

Further, the plurality of respective branches in the inductively coupled coil are connected in parallel, and a variable capacitor is connected at an input end thereof in series. And impedance of each coil can be changed by changing the variable capacitor connected in series, and the grounded capacitor determines positions of the maximum and minimum current and voltage on the coil. Thus, the current and voltage on each coil is adjustable so that the plasma density can be adjusted to control the plasma uniformity by adjusting the current ratio of the current on the internal coil to the current on the external coil.

The invention is mainly adapted to a semiconductor wafer manufacturing apparatus. However, it is equally well adapted to other related devices.

Additional aspects and advantages of the embodiments of present invention will be given in part in the following descriptions, become apparent in part from the following descriptions, or be learned from the practice of the embodiments of present invention.

BRIEF DESCRIPTION OF THE DRAWINGS

These and other aspects and advantages of the invention will become apparent and more readily appreciated from the following descriptions taken in conjunction with the drawings in which.

DETAILED DESCRIPTION OF EMBODIMENTS OF THE INVENTION

Figure 1:
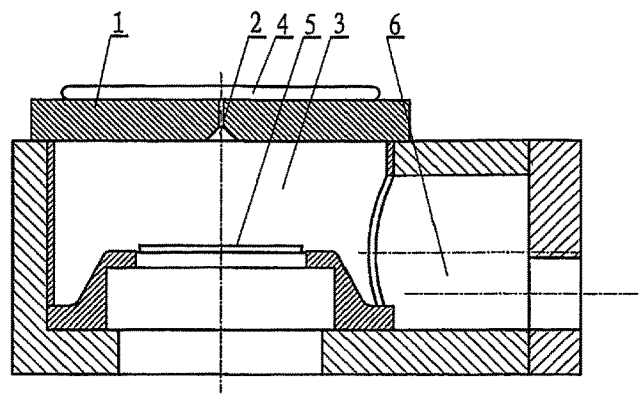
FIG. 1 is a schematic view of an inductively coupled plasma device according to prior art.
Figure 2:
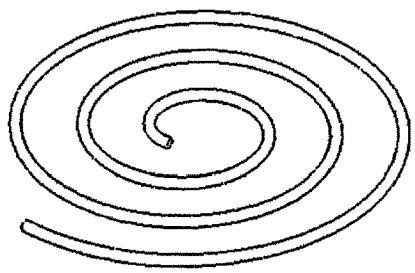
FIG. 2 is a schematic view of an inductively coupled coil according to prior art.

Reference will be made in detail to embodiments of the present invention. The embodiments described herein with reference to drawings are explanatory, illustrative, and used to generally understand the present invention. The embodiments shall not be construed to limit the present invention. The same or similar elements and the elements having same or similar functions are denoted by like reference numerals throughout the descriptions.

Figure 3:
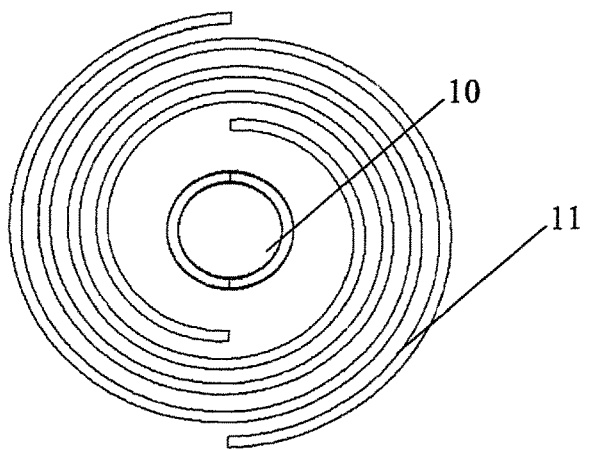
FIG. 3 is a schematic view of a planar structure of an inductively coupled coil according to an embodiment of the invention.
Figure 4:
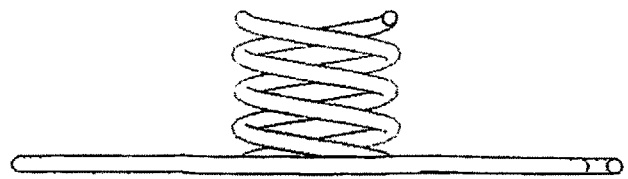
FIG. 4 is a schematic view of a spatial structure of an inductively coupled coil according to an embodiment of the invention.
Figure 5:
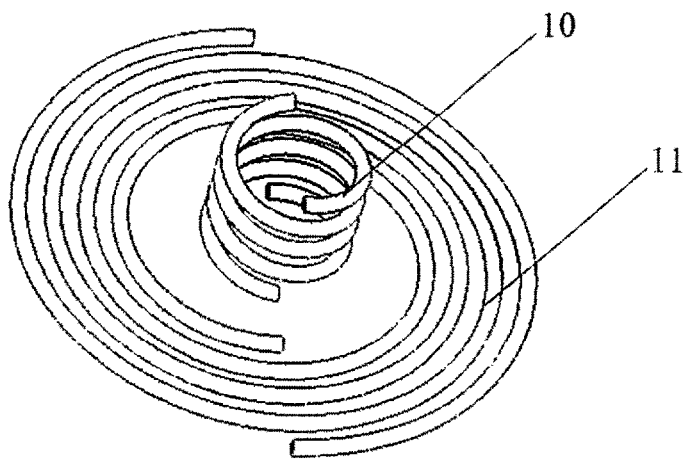
FIG. 5 is a schematic view of a spatial structure of an inductively coupled coil according to an embodiment of the invention.
Figure 6:
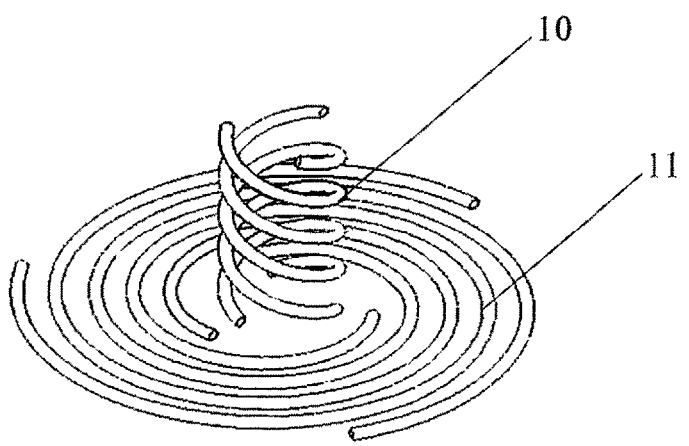
FIG. 6 is a schematic view of a spatial structure of an inductively coupled coil according to an embodiment of the invention.

Referring to FIG. 3, the inductively coupled coil according to an embodiment of the invention comprises an internal coil 10 and an external coil 11. The internal coil 10 and the external coil 11 are respective of each other and coaxially arranged with each other.

The internal coil 10 consists of a plurality of internal respective branches which are nested together, and the internal respective branches are substantially the same and symmetrically arranged with respect to an axis of the inductively coupled coil. The external coil 11 consists of a plurality of external respective branches which are nested together, and the external respective branches are substantially the same and symmetrically arranged with respect to an axis of the inductively coupled coil.

The internal coil 10 may have a spatial structure, a planar structure, or a planar-spatial combined structure. Similarly, the external coil 11 may have a spatial structure, a planar structure, or a planar-spatial combined structure.

FIGS. 3-6 show embodiments of the invention. The internal coil 10 of the inductively coupled coil in FIGS. 3-6 has a spatial structure in which helical line ascends upwardly along the axis of the internal coil with each circle of the helical line having substantially the same diameter.

It should be noted that, as a person normally skilled in the art may understand, the internal coil 10 spirally ascending along the axis may also adopt a structure in which the diameter gradually decreases or increases as the helical line ascends accordingly. And the helical line can ascend at an equal interval or unequal interval.

The external coil 11 according to embodiments of the invention shown in FIGS. 3-6 adopts a planar structure, and each respective external branch extends circumferentially in a plane perpendicular to an axis of the external coil 11. The extending line can be of a helical line, such as an archimedes helical line, an involute line or a vortex line.

It should also be noted that, as a person normally skilled in the art may understand, geometric combinations of the internal coil 10 and the external coil 11 as shown in the embodiment of FIGS. 3-6 are not limited to those disclosed in the accompanying figures. More specifically, the configurational combination of the internal coil 10 and the external coil 11 can be achieved by any one of following manners:

Both the internal coil 10 and the external coil 11 have planar structures respectively; the internal coil 10 has a planar-spatial combined structure, and the external coil 11 has a planar structure; the internal coil 10 has a planar structure, and the external coil 11 has a planar-spatial combined structure; the internal coil 10 has a planar-spatial combined structure, and the external coil 11 has a spatial structure; the internal coil 10 has a spatial structure, and the external coil 11 has a planar-spatial combined structure; the internal coil 10 has a planar structure, and the external coil 11 has a spatial structure; the internal coil 10 has a spatial structure, and the external coil 11 has a planar structure; the internal coil 10 has a planar-spatial combined structure, and the external coil 11 has a planar-spatial combined structure.

As shown in FIGS. 3-6, the internal and the external coils 10, 11 may have a plurality of respective branches respectively. For example, the internal coil 10 in FIGS. 3-5 comprises two branches, whereas the external coil 11 comprises two branches too. The internal coil 10 in FIG. 6 comprises 3 branches and the external coil 11 comprises 3 branches too. Theoretically, the number of the included branches in the internal coil 10 and the external coil 11 may be an integer which is not less than 2, as long as the included branches are arranged symmetrically with respect to an axis thereof.

Figure 7:
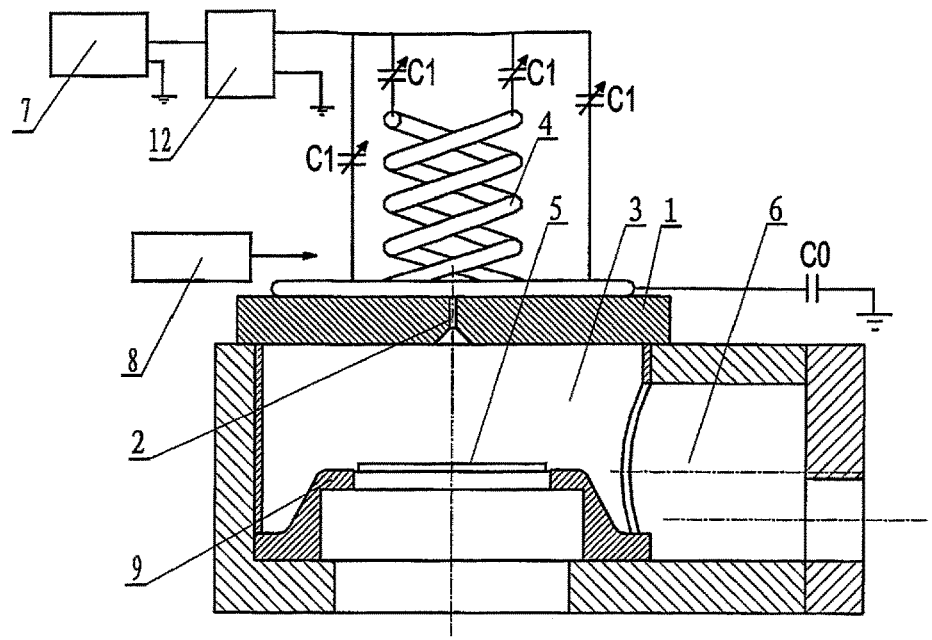
FIG. 7 is a schematic view of an inductively coupled plasma device according to a first embodiment of the invention.

FIG. 7 shows an inductively coupled plasma device according to a first embodiment of the invention in which the inductively coupled coil described above is applied. The inductively coupled plasma device comprises: a reaction chamber 3, a chuck 9 provided in the reaction chamber 3 for holding a wafer 5; and a dielectric window 1 provided at an top portion of the reaction chamber 3, an inlet 2 is provided at the middle part of the dielectric window 1, and processing gas is introduced into the reaction chamber 3 through the gas inlet 2 by a gas introducing device 8.

An inductively coupled coil 4 is provided on top of the dielectric window 1, and an input end of the inductively coupled coil 4 is connected with a RF (Radio Frequency) source 7 by a match 12. An output end of the inductively coupled coil 4 is grounded via a grounding capacitor C0. When an induced electric field is generated in the reaction chamber 3, the gas entering into the reaction chamber 3 is excitated into plasma for etching the wafer 5.

The plurality of internal and external respective branches of the internal coil 10 and the external coil 11 in the inductively coupled coil are connected in parallel, and the input ends of the plurality of respective internal and external branches are connected with variable capacitors C1 in series respectively.

By adjusting the variable capacitor C1 in series, impedance of each coil can be changed. And the ground capacitor C0 determines the positions of the maximum and minimum current and voltage on the coil. Thus, the current and voltage on each coil is adjustable so that the plasma density can be adjusted to control the plasma uniformity by adjusting the current ratio on the internal and external coils.

Figure 8:
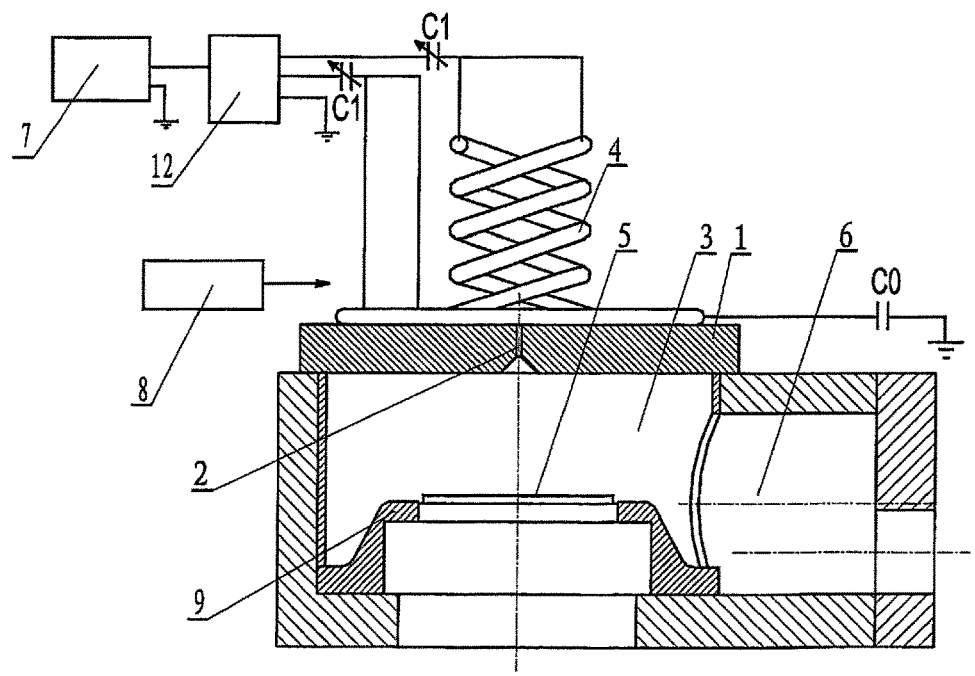
FIG. 8 is a schematic view of an inductively coupled plasma device according to a second embodiment of the invention.

FIG. 8 shows an inductively coupled plasma device according to second embodiment of the invention in which the inductively coupled coil described above is applied. The plurality of internal respective branches of the internal coil 10 in the inductively coupled coil are connected in parallel, and the input ends thereof are connected to an variable capacitor C1, then connected with the RF (radio frequency) source 7 via a match 12. The plurality of external respective branches of the external coil 11 in the inductively coupled coil are connected in parallel, and the input ends thereof are connected to an variable capacitor C1, then connected with the RF (radio frequency) source 7 via the match 12.

Figure 9:
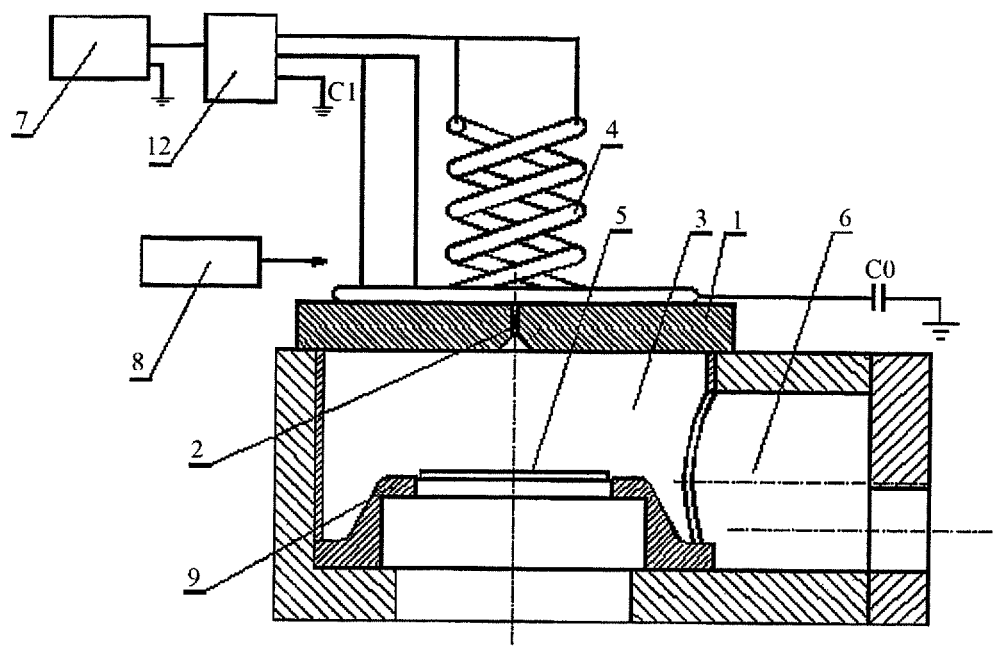
FIG. 9 is a schematic view of an inductively coupled plasma device according to a third embodiment of the invention.

FIG. 9 shows an inductively coupled plasma device according to second embodiment of the invention in which the inductively coupled coil described above is applied. The plurality of internal respective branches of the internal coil 10 in the inductively coupled coil are connected in parallel, then connected with a RF (radio frequency) source 7 via a match 12. The plurality of external respective branches of the external coil 10 in the inductively coupled coil are connected in parallel, then connected with the RF (radio frequency) source 7 via the match 12.

There can be one or more RF (radio frequency) sources in the invention, and the plurality of respective branches can be connected with the RF (radio frequency) sources via matchs 12 respectively.

The inductance of the coil according to the invention is decreased due to two complete symmetrical branches of internal and external coils connected in parallel. Meanwhile, the electromagnetic field in the reaction chamber distributes more uniformly by the completely symmetrical design of the coils, and the plasma distributes more evenly and symmetrically in radial and circumferentially. In addition, the distribution uniformity of the plasma inside the reaction chamber is ameliorated so that the etching rates of dots on the wafer surface are closer to each other. Even when the dimension of the wafer increases, the etching rate and uniformity from the center of the wafer to the peripheral portion thereof can be favorably controlled.

The invention is mainly adapted to a semiconductor wafer manufacturing apparatus. However, it is equally well adapted to other related devices.

Although explanatory embodiments have been shown and described, it would be appreciated by those skilled in the art that changes, alternatives, and modifications can be made in the embodiments without departing from spirit and principles of the invention. Such changes, alternatives, and modifications all fall into the scope of the claims and their equivalents.

What is claimed is:

1. An inductively coupled coil, comprising:
    an internal coil and an external coil which are distinct from each other and coaxially arranged with respect to each other;
    the internal coil comprising a plurality of distinct internal branches having a same configuration which are nested together, the plurality of distinct internal branches being electrically connected in parallel and arranged symmetrically with respect to an axis of the inductively coupled coil, the configuration of the distinct internal branches including a radius from a point on each distinct internal branch to the axis, and currents flowing through the distinct internal branches being of a same direction;
    the external coil comprising a plurality of distinct external branches having a same configuration which are nested together, the plurality of distinct external branches being electrically connected in parallel and arranged symmetrically with respect to the axis of the inductively coupled coil, the configuration of the distinct external branches including a radius from a point on each distinct external branch to the axis, and currents flowing through the distinct external branches being of the same direction;
    the internal coil having a planar structure and the external coil having a spatial structure;
    an input end of each internal branch and each external branch being connected to an RF (radio frequency) source through a variable capacitor in series;
    output ends of the distinct internal branches and the distinct external branches being connected to a same grounding capacitor; and
    the variable capacitors and the same grounding capacitor being configured to adjust an impedance of each internal branch and each external branch and positions of maximum and minimum currents and voltages on the internal branches and the external branches.

2. The inductively coupled coil according to claim 1, wherein each of the plurality of distinct external branches defines a helical line.

3. The inductively coupled coil according to claim 2, wherein each of the plurality of distinct internal branches defines an Archimedes line, an involute line or a vortex line.

4. The inductively coupled coil according to claim 2, wherein each of the plurality of distinct external branches spirally winds upwardly along the axis thereof.

5. The inductively coupled coil according to claim 4, wherein diameters of each of the plurality of distinct external branches are configured substantially the same, or gradually become smaller or larger.

6. The inductively coupled coil according to claim 4, wherein
    each of the plurality of distinct external branches ascend in equal intervals or unequal intervals.

7. The inductively coupled coil according to claim 1, wherein
    the internal coil comprises n distinct internal branches, and the external coil comprises n distinct external branches, where n is an integer equal to or greater than 2.

8. The inductively coupled coil according to claim 1, wherein:
    the input end of each internal branch and each external branch is connected in parallel to the RF source through a variable capacitor in series;
    the inductively coupled coil is provided on a dielectric window provided at a top of a reaction chamber, and the inductively coupled coil is connected with the RF source via a match.

9. The inductively coupled coil according to claim 7, wherein:
    the input ends of the internal branches are connected and further connected to the RF source through a variable capacitor, and the input ends of the external branches are connected and further connected to the RF source through a same variable capacitor, respectively;
    the inductively coupled coil is provided on branches dielectric window provided at a top of a reaction chamber, and the inductively coupled coil is connected with the RF source via a match.

10. An inductively coupled coil, comprising:
an internal coil and an external coil which are distinct from each other and coaxially arranged with respect to each other;
the internal coil comprising a plurality of distinct internal branches having a same configuration which are nested together, the plurality of distinct internal branches being electrically connected in parallel and arranged symmetrically with respect to an axis of the inductively coupled coil, the configuration of the distinct internal branches including a radius from a point on each distinct internal branch to the axis, and currents flowing through the distinct internal branches being of a same direction;
the external coil comprising a plurality of distinct external branches having a same configuration which are nested together, the plurality of distinct external branches being electrically connected in parallel and arranged symmetrically with respect to the axis of the inductively coupled coil, the configuration of the distinct external branches including a radius from a point on each distinct external branch to the axis, and currents flowing through the distinct external branches being of the same direction;
the internal coil having a combination of a planar structure and a spatial structure, and the external coil having a spatial structure;
an input end of each internal branch and each external branch being connected to an RF (radio frequency) source through a variable capacitor in series;
output ends of the distinct internal branches and the distinct external branches being connected to a same grounding capacitor; and
the variable capacitors and the same grounding capacitor being configured to adjust an impedance of each internal branch and each external branch and positions of maximum and minimum currents and voltages on the internal branches and the external branches.

11. The inductively coupled coil according to claim 10, wherein each of the plurality of distinct external branches defines a helical line.

12. The inductively coupled coil according to claim 11, wherein each of the plurality of distinct external branches spirally winds upwardly along the axis thereof.

13. The inductively coupled coil according to claim 12, wherein diameters of each of the plurality of distinct external branches are configured substantially the same, or gradually become smaller or larger.

14. The inductively coupled coil according to claim 12, wherein
each of the plurality of distinct external branches ascend in equal intervals or unequal intervals.

15. The inductively coupled coil according to claim 10, wherein
the internal coil comprises n distinct internal branches, and the external coil comprises n distinct external branches, where n is an integer equal to or greater than 2.

16. The inductively coupled coil according to claim 10, wherein:
the input end of each internal branch and each external branch is connected in parallel to the RF source through a variable capacitor in series;
the inductively coupled coil is provided on a dielectric window provided at a top of a reaction chamber, and the inductively coupled coil is connected with the RF source via a match.

17. The inductively coupled coil according to claim 15, wherein:
the input ends of the internal branches are connected and further connected to the RF source through a variable capacitor, and the input ends of the external branches are connected and further connected to the RF source through a same variable capacitor, respectively;
the inductively coupled coil is provided on a dielectric window provided at a top of a reaction chamber, and the inductively coupled coil is connected with the RF source via a match.

18. An inductively coupled coil, comprising:
an internal coil and an external coil which are distinct from each other and coaxially arranged with respect to each other;
the internal coil comprising a plurality of distinct internal branches having a same configuration which are nested together, the plurality of distinct internal branches being electrically connected in parallel and arranged symmetrically with respect to an axis of the inductively coupled coil, the configuration of the distinct internal branches including a radius from a point on each distinct internal branch to the axis, and currents flowing through the distinct internal branches being of a same direction;
the external coil comprising a plurality of distinct external branches having a same configuration which are nested together, the plurality of distinct external branches being electrically connected in parallel and arranged symmetrically with respect to the axis of the inductively coupled coil, the configuration of the distinct external branches including a radius from a point on each distinct external branch to the axis, and currents flowing through the distinct external branches being of the same direction;
the internal coil having a combination of a planar structure and a spatial structure, and the external coil having a combination of a planar structure and a spatial structure;
an input end of each internal branch and each external branch being connected to an RF (radio frequency) source through a variable capacitor in series;
output ends of the distinct internal branches and the distinct external branches being connected to a same grounding capacitor; and
the variable capacitors and the same grounding capacitor being configured to adjust an impedance of each internal branch and each external branch and positions of maximum and minimum currents and voltages on the internal branches and the external branches.

19. The inductively coupled coil according to claim 18, wherein one of the plurality of distinct external branches and one of the plurality of distinct internal branches define a helical line and another one of the plurality of distinct external branches and another one of the plurality of distinct internal branches define an Archimedes line, an involute line, or a vortex line.

20. The inductively coupled coil according to claim 18, wherein
the internal coil comprises n distinct internal branches, and the external coil comprises n distinct external branches, where n is an integer equal to or greater than 2.

* * * * *